United States Patent
Botts

(10) Patent No.: US 8,461,861 B2
(45) Date of Patent: Jun. 11, 2013

(54) ENERGY USAGE MONITOR FOR A HOUSEHOLD APPLIANCE

(75) Inventor: Ronald Botts, New Bern, NC (US)

(73) Assignee: BSH Home Appliances Corporation, Irvine, CA (US)

( * ) Notice: Subject to any disclaimer, the term of this patent is extended or adjusted under 35 U.S.C. 154(b) by 941 days.

(21) Appl. No.: 12/268,465

(22) Filed: Nov. 11, 2008

(65) Prior Publication Data

US 2010/0117625 A1    May 13, 2010

(51) Int. Cl.
*G01R 31/40* (2006.01)
*G01R 21/00* (2006.01)

(52) U.S. Cl.
USPC .................................. 324/764.01; 324/103 R

(58) Field of Classification Search
USPC ................ 324/103 R, 140–142, 770, 764.01; 340/825.06, 870.02; 700/295, 297, 62; 62/238.6, 430, 433, 440
See application file for complete search history.

(56) References Cited

U.S. PATENT DOCUMENTS

| | | | |
|---|---|---|---|
| 4,076,554 A | 2/1978 | Weihe | |
| 4,568,934 A | 2/1986 | Allgood | |
| 4,644,320 A * | 2/1987 | Carr et al. | 340/12.37 |
| 4,672,555 A | 6/1987 | Hart et al. | |
| 4,858,141 A | 8/1989 | Hart et al. | |
| 4,901,007 A | 2/1990 | Sworm | |
| 5,315,236 A | 5/1994 | Lee | |
| 5,483,153 A | 1/1996 | Leeb et al. | |
| 5,811,966 A | 9/1998 | Lee | |
| 5,869,960 A | 2/1999 | Brand | |
| 6,148,623 A | 11/2000 | Park et al. | |
| 6,216,479 B1 * | 4/2001 | Elwood | 62/230 |
| 6,552,525 B2 | 4/2003 | Bessler | |
| 6,870,463 B2 | 3/2005 | Dresti et al. | |
| 6,906,617 B1 | 6/2005 | Van der Meulen | |
| 2006/0123807 A1 * | 6/2006 | Sullivan et al. | 62/129 |
| 2009/0019875 A1 * | 1/2009 | Fink et al. | 62/259.2 |

FOREIGN PATENT DOCUMENTS

DE    60104227 T2    9/2005

* cited by examiner

*Primary Examiner* — Tung X Nguyen
(74) *Attorney, Agent, or Firm* — James E. Howard; Andre Pallapies

(57) ABSTRACT

An energy usage monitor for a household appliance, and a method of monitoring energy usage of a household appliance, are provided. The system and method include a system and an energy usage monitor that monitors energy usage information of the system of the household appliance. The system and method may include outputting energy usage information of the system of the household appliance based on the energy usage determined by the energy usage monitor.

29 Claims, 4 Drawing Sheets

ENERGY USAGE MONITOR FOR A HOUSEHOLD APPLIANCE

FIELD OF DISCLOSURE

The present invention relates to a household appliance, and particularly, to a household appliance that monitors energy usage, and more particularly, to a system and method of monitoring energy usage for a household appliance.

BACKGROUND

Recently, energy prices have become a major concern for many consumers. Many consumers also have become increasingly concerned with their impact on the environment. Hence, energy efficient appliances have become increasingly popular with consumers, for example, to lower energy usage expenses associated with the appliances, as well as reducing an impact on the environment.

Many appliances receive an ENERGY STAR rating that indicates the level of energy efficiency of the appliance. The ENERGY STAR program is a joint program of the U.S. Environmental Protection Agency (EPA) and the U.S. Department of Energy that rates the energy efficiency of products and practices based on whether they meet strict energy efficiency guidelines set by the EPA and U.S. Department of Energy. The ENERGY STAR label commonly is provided on major appliances, office equipment, lighting, home electronics, and more. The ENERGY STAR label also has been extended to cover new homes and commercial and industrial buildings. These products may deliver the same or better performance as comparable models while using less energy and saving money.

In order to lower energy costs and protect the environment, there is a need to monitor the actual energy usage of appliances, such as household appliances. Referring to FIG. 1, conventional energy usage or monitoring devices 102 have been installed between a household appliance 104 and an external power source 106 to detect the power usage of the appliance 104. In some conventional systems, the power cord of the appliance is plugged into the energy usage devices, which is in turn plugged into a wall outlet. Other conventional energy usage devices may be mounted to a nearby or adjacent wall and require an extension cord to connect the appliance to the monitoring device.

SUMMARY

The present invention relates to a household appliance, and particularly, to a household appliance that monitors energy usage, and more particularly, to a system and method of monitoring energy usage for a household appliance.

The present invention recognizes that the conventional devices for detecting or monitoring energy usage only detect the usage for the overall appliance since the power is monitored external to the appliance. Also, the power coming into the appliance may fluctuate, and therefore, may provide inconsistent or inaccurate energy usage information at times. The conventional energy usage devices also do not distinguish between power usage of individual subsystems within an appliance. Further, the conventional energy usage devices do not provide any indication of the causes of the energy usage and do not provide suggestions for improving energy usage.

To solve the problems with the conventional energy usage devices, aspects of the present invention provide a household appliance having an internal energy usage monitor that detects or monitors the energy usage for an appliance. The present invention can distinguish between power usage of individual subsystems within an appliance, provide an indication of the causes of the energy usage, and/or provide suggestions for improving energy usage. Aspects of the present invention can detect or monitor the energy usage for subsystems within an appliance, which may provide valuable information with respect to energy usage.

The present invention further recognizes that the environmental conditions in which the appliance is operating can affect the energy usage of the appliance. Aspects of the present invention provide an energy usage monitor that takes into account environmental conditions of the location of the appliance.

The present invention further recognizes that there are important advantages to educating the consumer on the actual energy usage of the appliance, for example, based on their particular usage of the appliance. The present invention also recognizes that the manufacturer may benefit from the energy usage information gathered from the appliance, for example, for improving energy usage, developing new designs, etc. Other aspects of the invention can convey energy usage information to the consumer or user, a technician, and/or the appliance manufacturer. Hence, these aspects provide important advantages in that the usage, maintenance, or future designs of an appliance may be modified based on this energy usage information.

Also, aspects may provide feedback and/or suggestions for reducing energy usage, such as usage patterns, maintenance required, etc. Hence, aspects of the present invention may provide an active role in reducing energy usage.

For example, aspects of the invention may track and record data to provide historical information and/or trends of energy usage of the overall appliance and/or of subsystems of the appliance. The historical information and/or trends may be based on usage or average usage over different time periods. The historical information or trends may be used by the consumer, technician, or manufacturer to provide feedback and verification of improvements to the appliance, or to changes in use of the appliance. The user, technician, or manufacturer may make changes based on this information. For example, the user may change their usage habits, the technician may change a maintenance schedule or approach, or the manufacturer may change or redesign a subsystem of the appliance based on the historical information or trends.

The present invention also recognizes that the manufacturer commonly is the most knowledgeable about the particular appliance, such as how the subsystems and devices of the appliance interact, the insulating qualities of the appliance, the number and type of motors, the control programs for running the appliance, etc. Hence, the manufacturer may be in a better position to provide suggestions for improving energy usage. The aspects of the present invention provide an energy usage monitor that takes into account information known by the manufacturer to provide suggestions based on the actual appliance, the subsystems of the appliance, and/or the performance characteristics of the appliance, among other things. In contrast, the conventional energy devices simply monitor the overall energy usage of the appliance.

Commonly, an ENERGY STAR rated appliance may save a consumer, for example, $50 to $60 per year in power usage costs. The present invention recognizes that by providing the consumer with detailed energy usage information and suggestions for lowering energy expenses based on the particular appliance, the consumer may save additional costs and further reduce operating expenses associated with the appliance. Further, the costs associated with maintaining and repairing the appliance may be reduced by providing energy usage information to the user, technician, and/or manufacturer.

In view of the above aspects of the invention, an exemplary embodiment is directed to a household appliance including a body enclosing an interior compartment, a door being movable between open and closed states with respect to the body for providing access to the interior compartment, a system for operating the household appliance, and an energy usage monitor that monitors energy usage of the system.

Another exemplary embodiment is directed to a household appliance including a system for operating the household appliance and an energy usage monitor that monitors energy usage of the system.

Another exemplary embodiment is directed to a method of monitoring an energy usage of a household appliance. The method includes determining the energy usage of a system of the household appliance using an energy usage monitor, and outputting energy usage information of the system of the household appliance based on the energy usage determined by the energy usage monitor.

The features of the invention, however, together with additional objects and advantages thereof will be best understood from the following description of exemplary embodiments when read in connection with the accompanying drawings.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Figure 1:
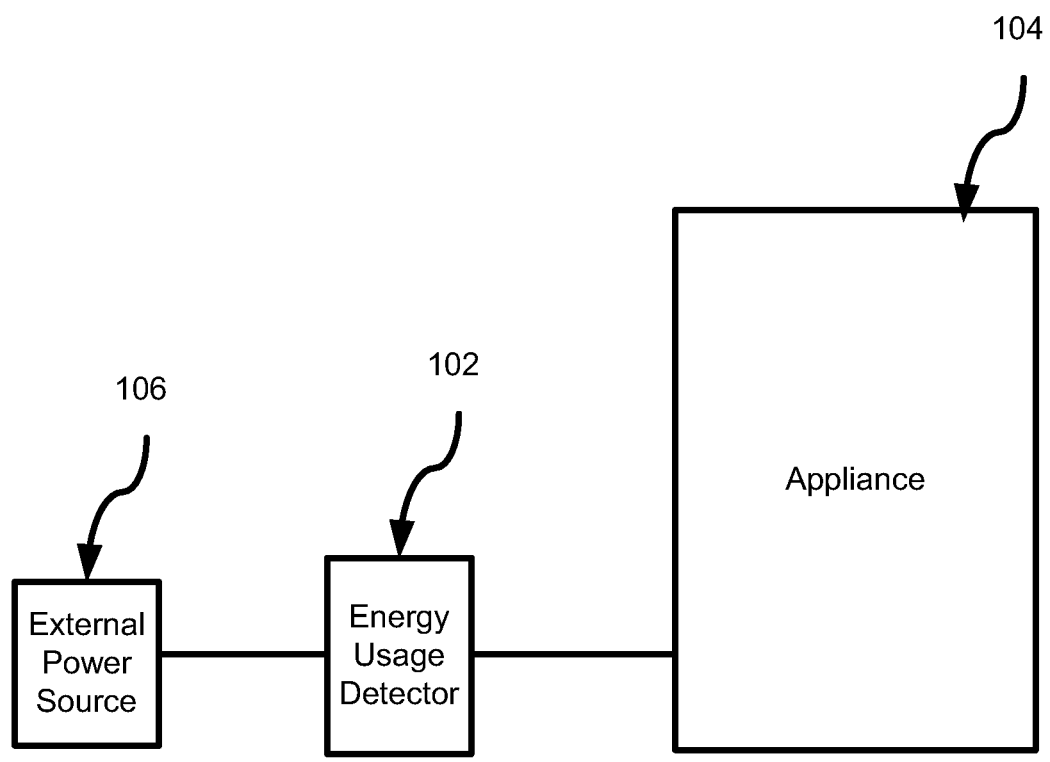
FIG. 1 is a schematic illustrating a conventional energy usage detection device.
Figure 2:
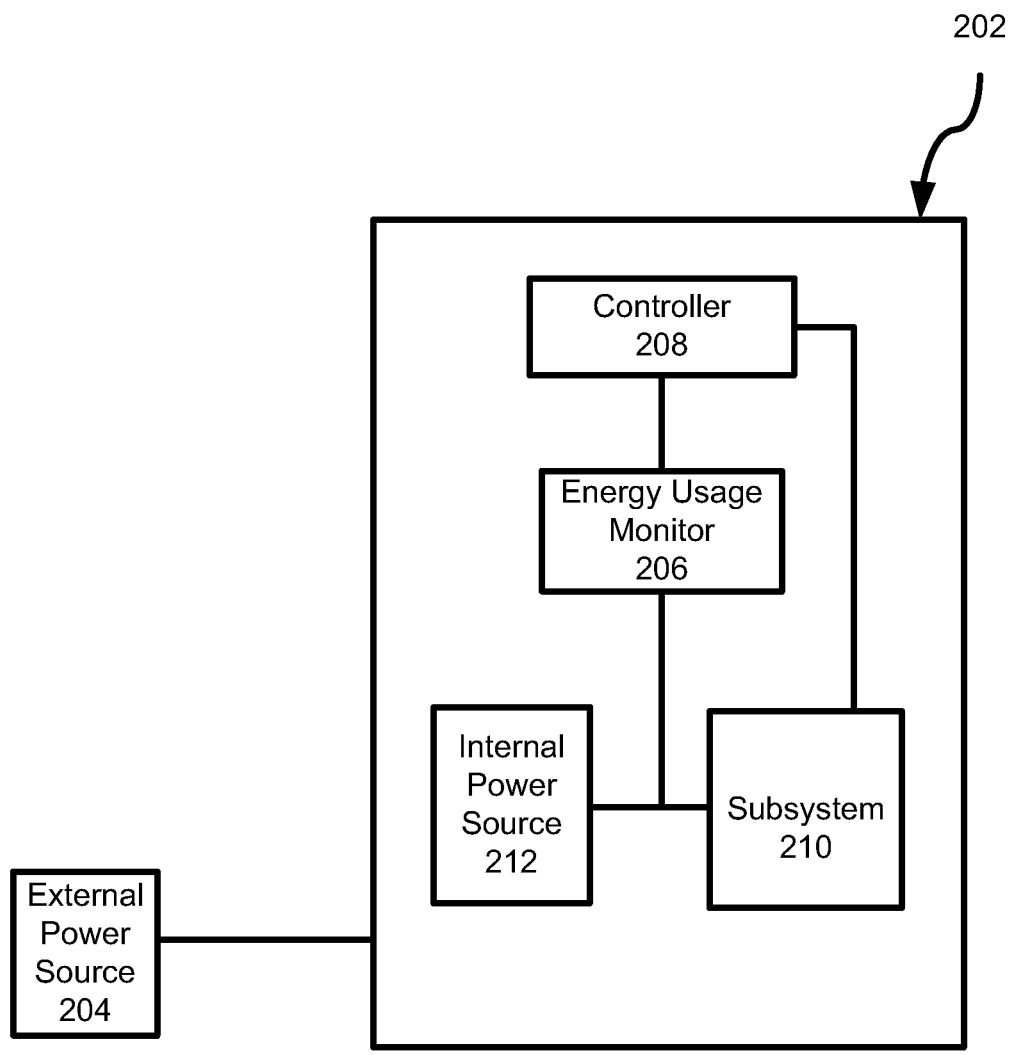
FIG. 2 is a schematic illustrating an appliance according to an embodiment of the invention.
Figure 3:
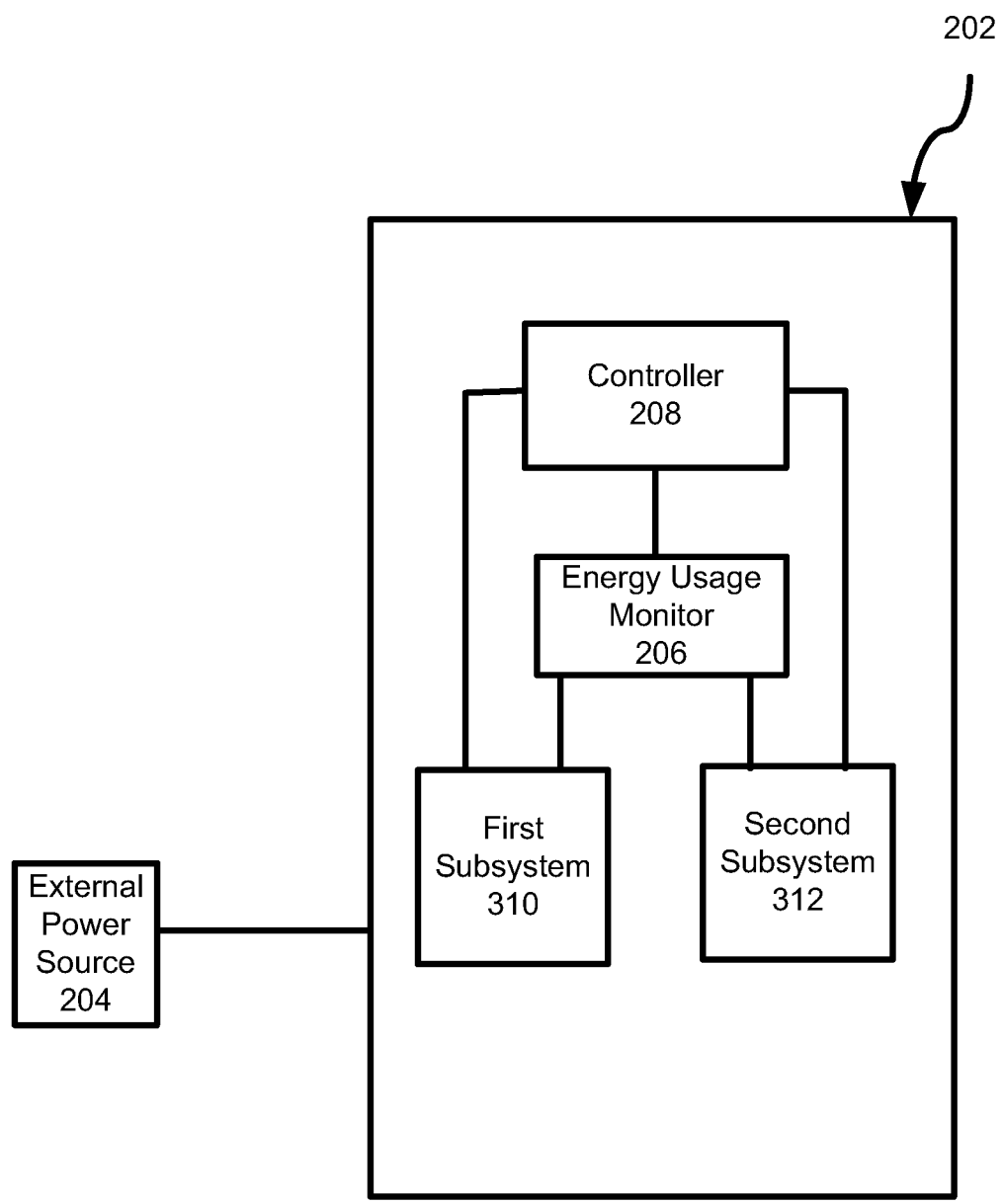
FIG. 3 is a schematic illustrating an appliance according to another embodiment of the invention.
Figure 4:
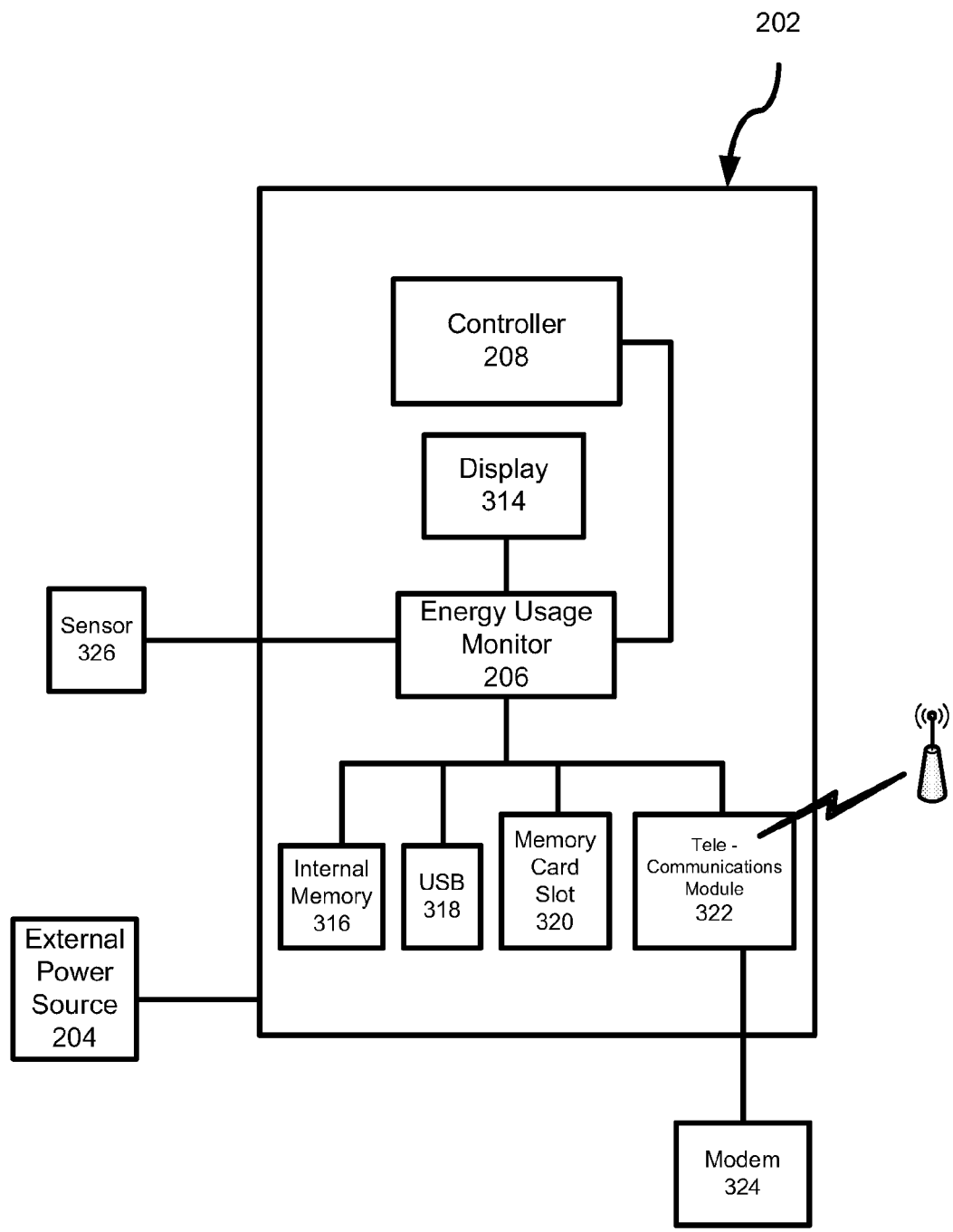
FIG. 4 is a schematic illustrating an appliance according to another embodiment of the invention.

With reference to FIGS. 2-4, exemplary embodiments of the invention will now be described.

Referring to FIG. 2, an embodiment includes a household appliance 202 that is connected to an external power source 204. The household appliance 202 includes a controller 208 that controls an operation of a subsystem 210. The household appliance also may have an internal power source 212 that supplies power to one or more subsystems 210. The controller 208 may control the operation of one or more subsystems 210 of the appliance 202. The internal power source may supply power to one or more subsystems of the appliance 202. Each subsystem of the household appliance may include a separate or dedicated internal power source, or one or more subsystems may share an internal power source. The household appliance 202 further includes an energy usage monitor 206 in communication with the controller 208 and/or the internal power source 212 of the appliance 202. The energy usage monitor may communicate with an internal power source of one or more subsystems of the appliance 202. In this aspect, the energy usage monitor 206 is built-in to the appliance 202.

The household appliance 202 can be any household appliance that consumes energy. For example, the appliance can be a refrigerator or freezer. More particularly, the appliance can be a side-by-side refrigerator/freezer with a freezer compartment on one side and a refrigerator compartment on the other side. The appliance can be a refrigerator/freezer having a refrigerator compartment on top with a freezer drawer compartment below. The appliance also can be a freezer only, or a refrigerator only. For example, the appliance can be a stand alone freezer or a refrigerated wine cabinet.

The household appliance 202 can be an oven or wall oven, a range, a cooktop, a microwave, a dishwasher, a washing machine, a dryer, an exhaust fan or vent, a heated or cooled built-in drawer, such as a drawer configured to dry and store dishes, eating utensils, and cooking utensils such as pots and pans.

The household appliance 202 is not limited to appliances that consume power (e.g., electrical power). The appliance 202 also can be other household appliances such as a water heater, an HVAC unit, system, or subsystem. The energy usage monitor 206 can be configured to determine any type of energy usage, such as electrical power usage, water usage, gas usage, etc.

The energy usage monitor 206 can be a discrete element in the appliance 202, integrated into another element of the appliance 202, or integrated into one or more elements of the appliance 202. In an embodiment, the energy usage monitor 206 can be a circuit or a software program or module that is incorporated into a microprocessor of the appliance 202, or the controller 208 of the appliance 202. The energy usage monitor 206 can communicate with the internal power source 212 for each subsystem within the appliance such that the energy usage monitor 206 can monitor and determine energy usage, such as power consumption, of the overall appliance and/or individual elements of the appliance. The energy usage monitor 206 can directly determine the energy usage at one or more locations within the appliance or for one or more subsystems within the appliance, as will be described in greater detail below. The energy usage monitor 206 also can diagnose problems and/or determine possible suggestions for improving energy usage, among other things, based on the energy usage information of the overall appliance and/or individual subsystems of the appliance.

In another embodiment, the energy usage monitor 206 can calculate the energy usage based on other factors. For example, in some cases, the power coming in to the appliance may fluctuate, and therefore, may provide inconsistent or inaccurate energy usage information at times. In an embodiment, the energy usage monitor may determine energy usage without actually monitoring the power usage of the appliance.

For example, as shown in FIG. 2, the energy usage monitor 206 is in communication with the controller 208. The controller 208 knows what operation, if any, the appliance 202 is performing and which subsystems of the appliance are running. For example, the controller 208 of a refrigerator may know when the compressor is running and for how long. The load associated with running the compressor also may be known. In this embodiment, the energy usage monitor 206 can communicate with the controller 208 to determine the power consumption of the compressor based on whether the compressor is running and the amount of time that the compressor is running, among other things. Hence, the energy usage monitor may determine energy usage without actually monitoring the power usage of the appliance.

In yet another embodiment, the energy usage monitor 206 can receive an input from one or more sensors for determining energy usage. For example, the energy usage monitor 206 can receive an input from a flow rate sensor for determining a flow rate of gas, air, or water, for example, through a supply line. The energy usage monitor 206 can provide energy usage information for the appliance 202 based on the determined energy usage, as well as other factors, as will be described in greater detail below.

Referring to FIG. 3, another embodiment can provide energy usage information for one or more subsystems of the appliance 202. In this embodiment, the household appliance 202 is connected to an external power source 204. The household appliance 202 includes an energy usage monitor 206 in communication with a controller 208 of the appliance 202. The controller 208 controls the operation of a first subsystem 310 and second subsystem 312 of the appliance 202. The energy usage monitor 206 also may be in communication with the first subsystem 310 and the second subsystem 312. The number of subsystems is not limited to two subsystems and can include any number of subsystems or combinations of subsystems. In another aspect, the energy usage monitor 206 may be in communication with one or more internal power sources of the first subsystem 310 and the second subsystem 312, such that the energy usage monitor 206 may directly monitor or determine the energy usage of the first subsystem 310 and the second subsystem 312. The internal power sources of the first and second subsystems 310, 312 are not illustrated merely to simplify the schematic of the appliance. Each subsystem may include a separate or dedicated internal power source, or one or more subsystems may share an internal power source.

For example, a combination refrigerator/freezer appliance may include a first compressor for the refrigerator compartment and a second compressor for the freezer compartment. This embodiment separately may detect and monitor the energy usage for each of the first compressor and the second compressor. As explained above, the energy usage monitor may communicate with one or more internal power sources of the first compressor and the second compressor to directly detect or monitor the power usage by these components. As another example, the energy usage monitor may communicate with the controller to determine when each of the first compressor and the second compressor are running and the period of time that each compressor is running, and then calculate the energy usage based on known energy usage data for each compressor. The known energy usage data may be stored in a memory unit of the appliance. These exemplary aspects can isolate and determine the energy usage information with respect to the usage of the refrigerator compartment and/or the freezer compartment. The individual energy information for each compartment may be beneficial and effective for identifying a particular source of high energy usage within an appliance, or to provide more detailed energy usage information. In stark contrast, the conventional energy usage systems can only monitor the energy usage for the overall appliance. The conventional energy usage systems do not monitor individual subsystems within the appliance or provide detailed energy usage information for subsystems within the appliance.

As another example, a cooking appliance, such as a range, may include an oven and a cooktop. This embodiment separately can detect and monitor the energy usage for each of the oven and the cooktop. Again, this individual energy information for each compartment may be effective for identifying a particular source of high energy usage within an appliance, or to provide more detailed energy usage information.

Referring again to FIGS. 2 and 3, the energy usage monitor 206 can provide energy usage information for the appliance 202 or for one or more subsystems 310, 312 of the appliance 202. The energy usage information can include the current energy usage, the energy usage over a period of time, the average or mean energy usage, etc. Additionally, the energy usage can be a predicted energy usage, among other things.

One of ordinary skill in the art will recognize that there are numerous factors that may contribute to the energy usage of a household appliance, including but not limited to the type of appliance, the environment in which the appliance is operating, the type of usage or operating cycle of the appliance, the number of consumers using the appliance, etc.

For example, each time a refrigerator door is opened, the temperature of the interior compartment of the refrigerator may change as a result of air from the exterior of the refrigerator entering the interior compartment. The interior compartment may include one or more of a refrigerator compartment, a freezer compartment, an ice maker compartment.

As another example, in some appliances having a freezer drawer below the refrigerator compartment, an ice maker is integrated into the door covering the refrigerator compartment so that water and ice can be provided in a manner similar to the side-by-side refrigerator/freezer. In this case, the opening and closing of the refrigerator door may affect the cooling efficiency of the ice maker or the ability of the ice maker to maintain the desired temperature setting for producing and storing ice cubes.

The energy usage information provided by the energy usage monitor 206 can include information on usage habits of a consumer. For example, the energy usage information can include the number of times the appliance door is opened, the times of the day when the appliance door is opened, and/or the length of time the appliance door remains open during each use. The energy usage information can include information or data with respect to the interior temperature of the appliance, such as the current temperature, the average temperature, the temperature range over a period of time, etc. Other examples of the energy usage information can include an "ON" time or a stand-by energy usage of the appliance, and an "ON" time or a stand-by energy usage of one or more subsystems within the appliance.

For example, for a cooking appliance such as an oven or wall oven, the energy usage information can include the preheat time, the "ON" time in which the heating elements are "ON", the circulating or exhaust fan "ON" time, and/or the stand-by energy usage for operating a display, clock, etc. For a cooking appliance such as a cooktop or stove, the energy usage information can include the number of burners being used, the temperature setting of each burner, and the "ON" time for each burner. For a dishwasher, the energy usage information can include the "ON" time for the dishwasher, the particular cycle being run, such as a heating cycle, washing cycle, drying cycle, sanitizing cycle, pre-rinse cycle, heavy cleaning cycle, the water temperature in the dishwasher, the water temperature outside the dishwasher, etc. The energy usage information is not limited to these examples and can include other information with respect to the appliance and usage habits of the consumer.

Referring to FIG. 4, another embodiment of the household appliance 202 can include one or more means for conveying the energy usage information to the consumer or user, a technician, or to the appliance manufacturer. For example, as shown in FIG. 4, the household appliance 202 is connected to an external power source 204. The household appliance 202 includes an energy usage monitor 206 in communication with a controller 208 of the appliance 202. The controller 208 controls the operation of the appliance including, for example, one or more subsystems (not shown) of the appliance 202. In an aspect, the energy usage monitor 206 can be in communication with one or more of the subsystems. In another aspect, the energy usage monitor 206 can be in communication with one or more internal power sources of the subsystems. The household appliance 202 includes one or more means for conveying the energy usage information, for example, to the consumer or user, a technician, or to the appliance manufacturer.

As shown in FIG. 4, the household appliance can include a display 314 for displaying energy usage information. The display 314 can be, for example, a liquid crystal display (LCD) mounted on or integrated into an exterior of the appliance 202. The display can show a variety of energy usage information, such as the current energy usage, the active energy usage, and/or the average energy usage. The display can provide a representation of an amount of the energy usage using, for example, letters or characters, numbers, symbols, or combinations thereof. The display also may provide phrases, sentences, or other visual representations. For example, the display also may provide one or more charts or graphs illustrating the energy usage. The display can be configured to display a variety of energy usage information and is not limited to the examples recited herein.

For example, the display 314 can provide information such as the number of times the appliance door is opened. This information can be provided for periods of time, such as the most active usage times for the appliance. For example, for a refrigerator, the most active usage times may be in the morning or after school or work. For an oven or range, the most active time may be in the early evening when the consumer commonly prepares dinner.

In another embodiment, the display 314 can output a code that can be referenced, for example, to a table or a product manual for the appliance to determine the energy usage of the appliance and/or one or more suggestions for improving energy usage, which will be described in greater detail below.

In another embodiment, a meter can be provided for indicating the energy usage. Alternatively, a code can be provided that can be referenced, for example, to a table or a product manual for the appliance to determine the energy usage of the appliance and/or one or more suggestions for improving energy usage, which will be described in greater detail below.

In yet another embodiment, an audible output that indicates the energy usage can be provided, for example, using a speaker or other device for outputting sound.

The appliance also can include a data transmission device or storage device. For example, in an embodiment, the appliance 202 can include one or more card slots 320 for memory devices, such as a secure digital (SD) card or other flash memory, such as a memory stick. Another embodiment can include an internal memory 316 for storing the energy usage information of the appliance 202. The energy usage information stored on the internal memory 316 can be copied to another storage medium, such as a secure digital (SD) card or other flash memory, such as a memory stick, or uploaded to another device for use by the consumer, a technician, the appliance manufacturer. In an embodiment, the energy usage information can be automatically uploaded by the controller, for example, at predetermined periods of time or based on an occurrence of a predetermined event, such as the energy usage exceeding a predetermined or threshold value.

In another embodiment, the appliance 202 can include a Universal Serial Bus (USB) port 318 or the like for communicating with another device, or downloading information from the appliance 202. The USB port 318 also can be used to upload information to the appliance 202.

In another embodiment, the appliance 202 can include a telecommunications module 322 in communication with a wired telecommunications network (e.g., via modem 324) or a wireless network.

The internal memory 316, the USB port 318, the memory card slot 320, and/or the telecommunications module 322 can be used to upload or download energy usage information from, or to, the appliance 202, for example, for use by the consumer, a technician, or the appliance manufacturer. One of ordinary skill in the art will recognize that other means for downloading or uploading the energy usage information may be provided within the spirit and scope of the invention.

As explained above, the energy usage information can be downloaded from the appliance 202. The connection can be wired or wireless, such as a wired telecommunications network, a wireless telecommunications network, a wireless computer network, or short range wireless communication. For example, the energy usage information can be connected to a wired or wireless network for transmitting the information to the consumer, the technician, or the manufacturer. The energy usage information can be transmitted via analog or digital communication techniques, such as radio frequency communication, microwave communication, or infrared (IR) communication. For example, the appliance can transmit the energy usage information using a cellular phone, Bluetooth technology, etc.

In an embodiment, the energy usage information can be downloaded to a laptop, a portable computer, a personal data assistant (PDA), or a cell phone by a technician for use by a consumer or user, a technician, or for transfer to the appliance manufacturer for analysis. The energy usage information also can be transferred or uploaded to a computer or storage device on the user's local network or to a remote network. The information can be displayed or accessed via a website provided by the appliance manufacturer, a service company, or a third party. The user can track their energy usage for one or more appliances.

Referring again to FIG. 4, the appliance 202 can include a sensor 326 in communication with the controller 208 and/or the energy usage monitor 206. The sensor 326 is illustrated outside the household appliance in FIG. 4. However, the sensor 326 may be mounted on or inside the household appliance in other embodiments. The sensor 326 may detect one or more predetermined conditions inside or outside the household appliance. For example, the sensor 326 can be a temperature sensor for measuring the ambient air temperature of the environment in which the appliance is located and/or a humidity sensor for measuring the ambient air temperature of the environment in which the appliance is located. The sensor 326 also can be a flow sensor, for example, for measuring fluid flow, such as air flow, water flow, or gas flow, depending on the type of energy being monitored. The energy usage monitor can receive an input from the sensor 326, either directly or indirectly. The sensor input can be used by the energy usage monitor for calculating the energy usage of the appliance or a subsystem of the appliance. The sensor input also can be used to evaluate problems with the operation of the appliance, to predict possible energy usage sources or causes, and/or to determine possible suggestions for improving the energy usage of the appliance.

For example, the environmental conditions in which the appliance is operating can affect the energy usage of the appliance. An embodiment of the present invention takes into account environmental conditions (e.g., the exterior environment of the appliance). In an exemplary embodiment, the sensor 326 can be a temperature sensor for detecting the ambient air temperature outside of the appliance, and/or a sensor for detecting the humidity in the air outside of the appliance.

The environmental conditions, such as the ambient air temperature and the air humidity outside of the appliance, may affect the efficiency of the appliance. The environmental conditions may be affected by factors such as whether a home has an HVAC unit, a humidifier, a temperature setting of the thermostat for the HVAC unit, and/or the climate where the home is located, among other things. As another example, the environmental conditions may be affected by the location and/or proximity of heating and cooling vents or return grills to the appliance. As yet another example, the environmental conditions may be affected by the location and/or proximity of other appliances, and particularly those appliances that generate heat, to the appliance being monitored. As a further example, the environmental conditions may be affected by the proximity of the appliance to a window or door of the home and the frequency with which the window or door is opened.

More particularly, in the example in which the appliance is a refrigerator/freezer, the appliance may need to operate the compressor more often in a home in which the ambient air temperature is high, as compared with a home in which the ambient air temperature is low. In the example in which the appliance is a dryer, the heating efficiency of a dryer may be affected by the temperature of the environment in which the dryer is operating. If the dryer is in a cold environment, the dryer may need to work harder to heat the interior compartment of the dryer to the desired temperature than in a case in which the dryer is in a warmer environment. Also, the intake air temperature of the dryer may affect the efficiency of the dryer.

Referring again to FIG. 4, the sensor 326 can be a sensor or device for detecting whether a door of the appliance in the open position or the closed position, or detecting a change of the door position from an open position to a closed position. For example, the change in door position can be detected using known devices for turning the interior light of the appliance ON and OFF based on the open or closed position of the door, such as a mechanical device that senses the door opening, a light sensor, a motion sensor, etc. In another embodiment, the sensor 326 can be configured to sense the ON or OFF state of the interior light of the appliance.

With reference to FIGS. 2-4, the energy usage monitor according to the embodiments can be configured to distinguish between energy usage by the overall appliance and energy usage by one or more internal systems or subsystems. For example, in the refrigerator/freezer appliance example, the energy usage monitor distinguishes between energy usage by a compressor of the refrigerator compartment or the compressor of the freezer compartment. The energy usage monitor can be configured to distinguish or isolate energy usage by the interior lights, the control panel, the display panel, the controller, etc. Accordingly, the embodiments can provide a more detailed and accurate representation of the energy usage of the appliance.

In another embodiment, the appliance 202 can provide suggestions to the consumer, the technician, or the appliance manufacturer for reducing or optimizing the energy usage of the appliance based on the energy usage information determined by the energy usage monitor 206. The suggestions can be conveyed in a similar manner as the energy usage information, as explained above, using the display 314, internal memory 316, USB port 318, memory card slot 320, and/or telecommunications module 322.

For example, the energy usage monitor can suggest one or more ways to improve or optimize the energy usage of the appliance. The suggestions can be particular to a number of factors, such as the type of appliance being used, the particular cycle of the appliance being run, the usage history of the appliance, etc. Since aspects of the invention can distinguish between energy usage of internal systems or subsystems, the embodiment also can provide suggestions for reducing power consumption based on the particular energy usage of one or more subsystems, or the usage habits of the consumer.

For example, the energy usage monitor can monitor the opening and closing of the appliance door, such as a refrigerator or freezer. More particularly, the energy usage monitor 206 can track a number, a time, and a duration of the open state of each door of the appliance. The energy usage monitor then may convey particular suggestions based on the number of times the door is opened, the duration the door is opened, or the time of day that the door is opened, or the like, as well as average or mean values of the same. If, for example, the appliance door is held in an open position for a long period of time each time the door is open (e.g., by a consumer standing with a refrigerator or freezer door in an open position and looking inside the interior compartment for a particular item), the energy usage monitor may provide a message or indicator on an LCD display (e.g., 314) of the appliance that suggests reducing the time that the door remains in the open position in order to reduce energy consumption.

In another embodiment, the energy usage monitor 206 may suggest raising or lowering the temperature setting of the refrigerator or freezer compartment to reduce or minimize energy usage of the subsystem or the overall appliance. As another example, an energy usage monitor 206 in a dishwasher may suggest selecting a particular wash cycle that uses less energy and/or may suggest avoiding higher energy consuming cycles, such as a sanitation cycle. As another example, an energy usage monitor 206 in a washing machine may suggest a particular cycle for cleaning a particular type of laundry.

Aspects of the energy usage monitor also may display the energy usage for various cycles of the appliance or other factors associated with the operation of the particular appliance. The energy usage may be a predetermined projected energy usage, an actual or current energy usage, a historical energy usage, or an average or mean energy usage, etc. For example, an energy usage monitor 206 in a washing machine may display the actual or projected energy usage for cleaning towels, jeans, or other garments and materials.

In another embodiment, the display 314 of the appliance may include an indicator for simply and easily conveying the energy usage of the appliance. For example, an embodiment may include one or more indicators on the appliance, or on the display panel of the appliance, that show whether the appliance is operating within a predetermined energy efficient range. More particularly, the indicator may be a green light (e.g., a green LED or symbol) when the energy usage of the appliance is within the predetermined energy efficient range. The indicator may be a red light (e.g., a red LED or symbol) when the energy usage of the appliance is outside of the predetermined energy efficient range. The one or more indicators can be particular to a subsystem of the appliance, such as the refrigerator or freezer of the appliance.

In another embodiment, the energy usage monitor 206 can communicate with the controller 208 of the appliance 202 to determine the particular operation that the appliance 202 currently is performing, and more particularly, which subsystems of the appliance 202 currently are performing the operation. The energy usage monitor 206 also may receive inputs with respect to other factors, such as a number of door opening and closings, a duration of door openings, an environmental condition, etc. Based on a comparison of one or more of the energy usage information and the other factors to a table or database, the energy usage monitor 206 can select a predetermined suggestion for reducing energy usage. The predetermined suggestions also can be based on probable causes associated with the energy usage factors, which may be determined in advance through testing. The suggestions also can be based on actual input from the controller or sensors.

Commonly, the manufacturer may be the most knowledgeable about the appliance, such as how the subsystems and devices of the appliance interact, the insulating qualities of the appliance, the number and type of motors, the control programs for running the appliance, etc. The manufacturer may be in a better position to provide suggestions for improving energy usage, as compared with energy devices that simply monitor the overall energy usage of the appliance. The energy usage monitor 206 according to another embodiment can take into account such information known by the manufacturer to provide suggestions based on the actual appliance, the subsystems of the appliance, and the performance characteristics of the appliance.

For example, the manufacturer can determine probable causes for a particular increase in energy consumption. If the energy usage information and/or other factors correspond to the predetermined probable cause, the energy usage monitor 206 may provide a corresponding predetermined suggestion. If, on the other hand, the energy usage information and/or the other factors do not correspond to a predetermined probable cause, the energy usage monitor 206 may convey predetermined suggestions for troubleshooting. For example, if the door of a refrigerator or freezer is not being opened, and the compressor is running more frequently or for longer time periods than during normal operation, the energy usage monitor may suggest that the user check environmental conditions of the appliance, such as whether the appliance is in proximity of a heating/cooling vent, an exterior door to the home, etc.

In another embodiment, a temperature and/or humidity sensor can be provided to detect temperature and/or humidity changes to determine if an external environmental condition is affecting the energy usage of the appliance.

Aspects of the invention also may diagnose current problems or predict possible future problems with the appliance based on the energy usage information. For example, the energy usage monitor may detect whether the ice maker of a refrigeration appliance is working. In an aspect, this information can be communicated to the energy usage monitor 206 by the controller 208 and the energy usage monitor 206 can convey the error or problem to the consumer, for example, via the display 314.

In another embodiment, the energy usage monitor 206 may convey to the consumer that one or more subsystems of the appliance are not operating properly, or are not operating within a predetermined performance range. The consumer can, in turn, contact the manufacturer or a technician for service. Alternatively, the manufacturer or technician can provide a software module, for example, on an SD card, for monitoring the operation of the appliance for a period of time, after which the manufacturer or technician can evaluate the data collected to assist with diagnosing the problems or performance of the appliance.

In another embodiment, the energy usage information can be used by the controller 208 of the appliance 202 to change or optimize the operation of the appliance 202 or the subsystems of the appliance 202. The controller 208 can adapt the operation of the appliance 202 based on the energy usage information to provide an adaptive appliance for actively improving energy usage. For example, the energy usage monitor 206 can determine a time period during each day during which the energy usage of the refrigerator is reduced or is at a minimum. The energy usage monitor 206 can communicate the information to the controller 208, which can reduce the use of the compressor during the determined time period.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor or microcontroller such that the processor or microcontroller can read information from, and write information to, the storage medium. In the alternative, the storage medium may be integral to the processor or microcontroller.

Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A household appliance comprising:
   a body enclosing an interior compartment;
   a door being movable between open and closed states with respect to the body for providing access to the interior compartment;
   a subsystem of a plurality of subsystems for operating the household appliance;
   an internal energy usage monitor that monitors an amount of energy usage of the subsystem over a time period and tracks and records energy usage information for the subsystem based on the amount of energy usage of the subsystem over the time period;
   a controller in communication with the subsystem and the internal energy usage monitor, the controller controlling an operation of the subsystem of the household appliance based on the energy usage information obtained by the internal energy usage monitor.

2. The household appliance according to claim 1, further comprising:
   a power source that supplies power to the system of the household appliance;
   wherein the internal energy usage monitor determines the amount of energy usage of the subsystem of the household appliance by monitoring an amount of the power supplied to the subsystem from the power source.

3. The household appliance according to claim 1, wherein the internal energy usage monitor receives operation information for the subsystem from the controller and determines the amount of energy usage of the subsystem of the household appliance based on the operation information.

4. The household appliance according to claim 1, further comprising:
   a display in communication with the energy usage monitor,
   wherein the display displays energy usage information for the subsystem of the appliance based on the amount of energy usage of the subsystem monitored by the internal energy usage monitor.

5. The household appliance according to claim 4, wherein the energy usage information includes a representation of the energy usage of the subsystem of the household appliance.

6. The household appliance according to claim 5, wherein the representation of the energy usage of the subsystem of the household appliance includes an amount of the energy usage.

7. The household appliance according to claim 5, wherein the representation of the energy usage of the subsystem of the household appliance includes a graphical representation of the energy usage.

8. The household appliance according to claim 4, wherein the energy usage information includes a suggestion for reducing the energy usage of the subsystem of the household appliance based on the amount of energy usage determined by the internal energy usage monitor.

9. The household appliance according to claim 4, wherein the subsystem of the household appliance includes a first subsystem and a second subsystem,
   wherein the internal energy usage monitor monitors energy usage of the first subsystem and the second subsystem system, and
   wherein the display displays a first energy usage information for the first subsystem and a second energy usage information for the second subsystem of the appliance based on the energy usage monitored by the internal energy usage monitor.

10. The household appliance according to claim 4, wherein the subsystem of the household appliance includes a first subsystem and a second subsystem, wherein the internal energy usage monitor monitors energy usage of the first subsystem and the second subsystem system, and
    wherein the display displays one of a first suggestion for reducing the energy usage of the first subsystem of the household appliance and a second suggestion for reducing energy usage of the second subsystem of the household appliance based on the energy usage monitored by the internal energy usage monitor.

11. The household appliance according to claim 1, further comprising:
    a sensor for detecting a predetermined condition,
    wherein the sensor is in communication with the internal energy usage monitor, and
    wherein the internal energy usage monitor receives an input from the sensor and determines the amount of energy usage of the subsystem based on the input from the sensor.

12. The household appliance according to claim 11, wherein the internal energy usage monitor outputs a suggestion for reducing the amount of energy usage based on the input from the sensor.

13. The household appliance according to claim 1, further comprising:
    a memory in communication with the internal energy usage monitor,
    wherein the memory stores energy usage information for the subsystem of the appliance based on the amount of energy usage of the subsystem monitored by the internal energy usage monitor.

14. The household appliance according to claim 1, further comprising:
    a data transmission device that transmits energy usage information for the subsystem of the appliance from the household appliance to an external device, wherein the energy usage information for the subsystem of the appliance is based on the amount of energy usage of the subsystem monitored by the internal energy usage monitor.

15. The household appliance according to claim 1, wherein the subsystem includes a plurality of subsystems, and
    wherein the internal energy usage monitor determines an amount of energy usage of one of the plurality of subsystems of the household appliance.

16. The household appliance of claim 1, wherein the controller controls the operation of the subsystem of the household appliance based on the amount of energy usage of the subsystem monitored by the internal energy usage monitor.

17. The household appliance of claim 1, further comprising:
    a power source that supplies power to the household appliance; and an internal power source in communication with the external power source, the internal power source supplying power to the subsystem of the household appliance, wherein the internal energy usage monitor determines the amount of energy usage of the subsystem of the household appliance by monitoring an amount of the power supplied to the subsystem from the internal power source.

18. The household appliance of claim 1, wherein the subsystem of the household appliance includes a first subsystem, wherein the internal energy usage monitor monitors a first amount of energy usage of the first subsystem, and wherein the controller controls operation of the first subsystem of the appliance based on the first amount of energy usage monitored by the internal energy usage monitor.

19. The household appliance of claim 18, wherein the subsystem of the household appliance further includes a second subsystem, wherein the internal energy usage monitor monitors a second amount of energy usage of the second subsystem, and wherein the controller controls operation of the first subsystem and the second subsystem of the appliance based on the first amount of energy usage and the second amount of energy usage monitored by the internal energy usage monitor.

20. A household appliance comprising:

a subsystem of a plurality of subsystems for operating the household appliance;

an internal energy usage monitor that monitors an amount of energy usage of the subsystem over a time period and tracks and records energy usage information for the subsystem based on the amount of energy usage of the subsystem over the time period; and a controller in communication with the subsystem and the internal energy usage monitor, the controller controlling an operation of the subsystem of the household appliance based on the energy usage information obtained by the internal energy usage monitor.

21. The household appliance according to claim 20, further comprising:

a power source that supplies power to the subsystem of the household appliance, wherein the internal energy usage monitor determines the amount of energy usage of the subsystem of the household appliance by monitoring an amount of power supplied to the subsystem by the power source.

22. The household appliance according to claim 20, wherein the internal energy usage monitor receives operation information for the subsystem from the controller and determines the amount of energy usage of the subsystem of the household appliance based on the operation information.

23. The household appliance of claim 20, wherein the controller controls the operation of the subsystem of the household appliance based on the amount of energy usage of the subsystem monitored by the internal energy usage monitor.

24. A method of monitoring an energy usage of a household appliance, the method comprising:

determining an amount of the energy usage of a subsystem of a plurality of subsystems of the household appliance over a time period using an internal energy usage monitor;

tracking and recording energy usage information for the subsystem based on the amount of energy usage of the subsystem over the time period;

outputting the energy usage information of the subsystem of the household appliance based on the amount of the energy usage determined by the internal energy usage monitor; and controlling, based on the energy usage information obtained by the internal energy usage monitor, an operation of the subsystem of the household appliance using a controller.

25. The method according to claim 24, wherein the amount of the energy usage of the subsystem of the household appliance is determined by monitoring an amount of power supplied to the subsystem by a power source.

26. The method according to claim 24, wherein the amount of the energy usage of the subsystem of the household appliance is determined based on operation information received from the controller that controls the operation of the subsystem of the household appliance.

27. The method according to claim 24, wherein the amount of the energy usage of the subsystem of the household appliance is determined based on a condition sensed by a sensor.

28. The method according to claim 24, wherein the amount of the energy usage information of the subsystem of the household appliance is output using one of a display, an interface device, a wired data transfer device, a wireless data transfer device, a memory, and an audio device.

29. The method of claim 24, further comprising:

controlling the operation of the subsystem of the household appliance using the controller based on the amount of the energy usage of the subsystem determined by the internal energy usage monitor.

* * * * *